United States Patent [19]

Baccei

[11] 4,367,583

[45] Jan. 11, 1983

[54] CONNECTOR MOUNTING PRESS

[75] Inventor: James S. C. Baccei, Terryville, Conn.

[73] Assignee: Litton Systems, Inc., Watertown, Conn.

[21] Appl. No.: 242,914

[22] Filed: Mar. 12, 1981

[51] Int. Cl.[3] .............................................. H05K 3/32

[52] U.S. Cl. ........................................ 29/739; 29/747; 29/845

[58] Field of Search ................. 29/842, 844, 845, 837, 29/838, 747, 739, 741, 764

[56] References Cited

U.S. PATENT DOCUMENTS

| | | | |
|---|---|---|---|
| 4,068,374 | 1/1978 | Coller | 29/747 |
| 4,089,104 | 5/1978 | Barry et al. | 29/739 X |
| 4,316,321 | 2/1982 | Wickham | 29/739 X |

OTHER PUBLICATIONS

Connector Press manufactured by AMP, Inc. depicted in FIGS. 21-24 of "Pre-Assembled Card-Edge Connectors for Faster Backplane Assembly" by A. S. Taylor.

*Primary Examiner*—Carl E. Hall
*Attorney, Agent, or Firm*—Brian L. Ribando

[57] ABSTRACT

A connector mounting press includes a vertically moveable insertion head and a moveable bed which supports a printed circuit board including a plurality of press fit connectors. The bed is indexable to locate a selected connector under the insertion head. Alignment pins on the insertion head accurately position the connector for receipt of a pair of combs which engage and individually press the contacts of the connector into the printed circuit board.

3 Claims, 4 Drawing Figures

CONNECTOR MOUNTING PRESS

The invention relates to a press for mounting preassembled press fit connectors on a printed circuit board.

Preassembled press fit connectors which comprise a plastic housing and a plurality of press fit contacts are well known in the art. Press fit contacts rely on a mechanical mating engagement with plated through holes on a circuit board in order to establish electrical contact therewith. Conventionally, such connectors are loosely inserted into aperture arrays of a circuit board after which a press tool is utilized to individually engage and press the contacts within the housing into mating engagement with the board. Since the press tool simultaneously engages each contact, care must be taken to assure proper alignment of the connector and tool during pressing.

It is an object of the present invention to provide an automatic press for mating a series of preassembled press fit connectors with an apertured printed circuit board.

Other objects and advantages of the present invention will become apparent from the following portion of the specification and from the accompanying drawings which illustrate, in accordance with the mandate of the patent statutes, a presently preferred embodiment incorporating the principles of the invention.

Referring to the drawings.

Figure 1:
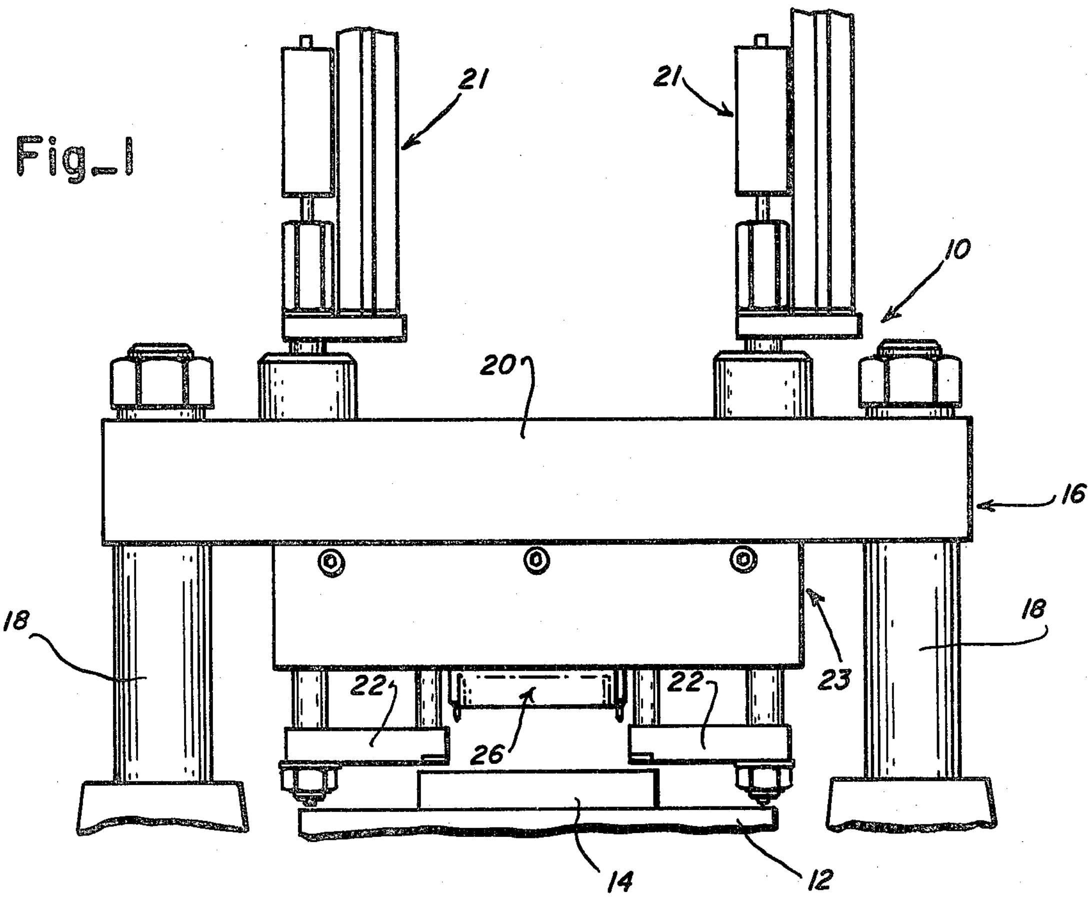
FIG. 1 is a front view of a connector mounting press according to the teachings of the present invention.

As shown in FIG. 1, the connector mounting press 10 generally includes a horizontally displaceable bed 12 with a pallet member 14 thereon and a press bar assembly 16 mounted at a predetermined location above the bed 12. The press bar assembly 16 includes two supporting guide members 18 which are hydraulically or electrically actuated to effect vertical displacement of a press bar 20 between a raised position, as shown, and a selectively determined lowered pressing position. As explained in detail below, a pair of sensor assemblies 21, each having a circuit board engaging sensor arm 22, precisely determines the pressing position during each pressing operation. A mounting assembly 23 secures a connector insertion head 26 to the press bar.

Figure 2:
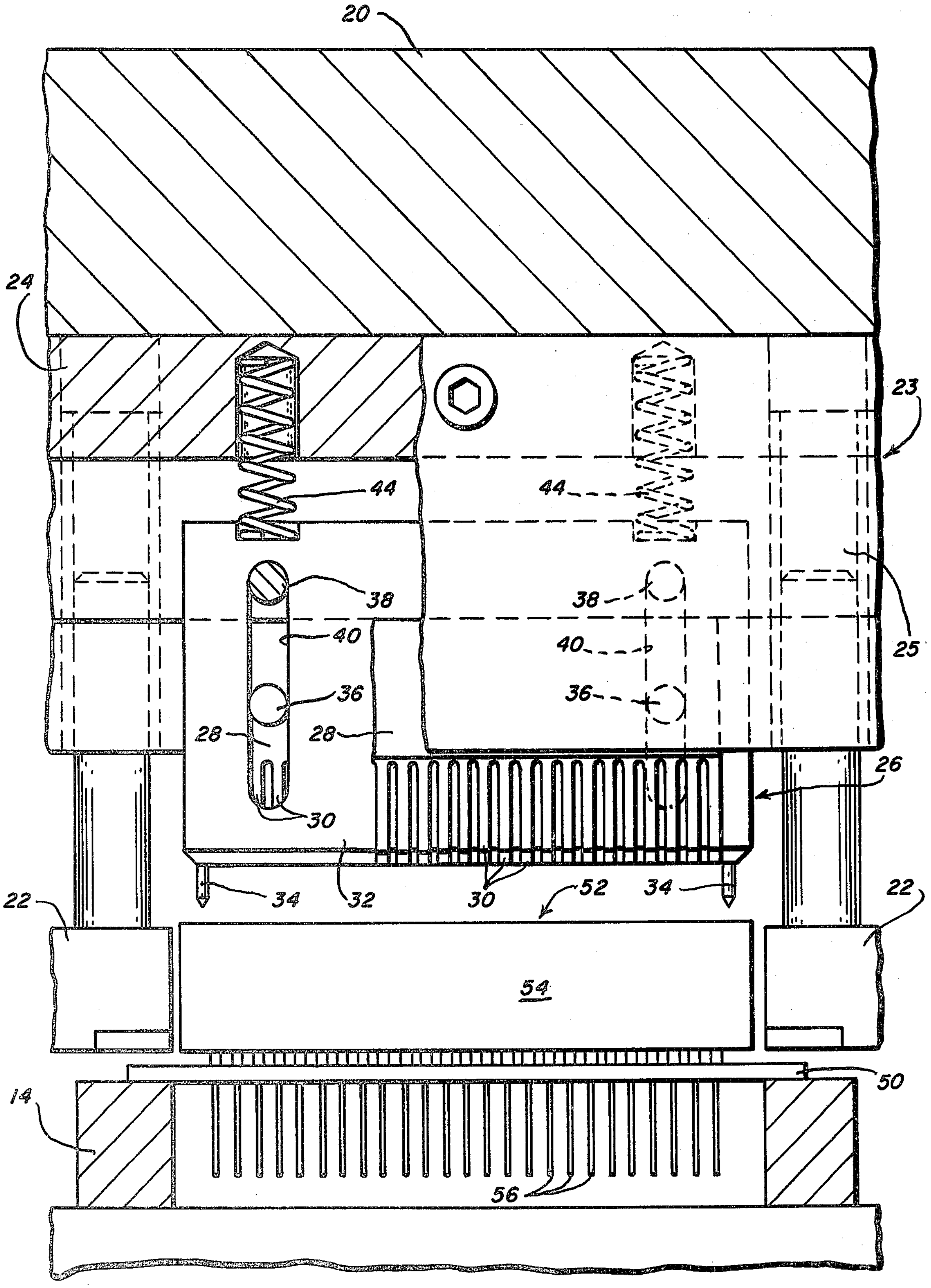
FIG. 2 is a front view of the insertion head positioned over a press fit connector.

As shown in FIG. 2, the mounting assembly 23 includes a press bar block 24 and a removable clamp 25 which secures the insertion head 26 therebetween. The insertion head 26 comprises front and rear insertion combs 28 each having a row of teeth 30. Mounted between the two insertion combs 28 is an alignment tool 32 including two alignment pins 34. Spaced pairs of vertically related pins 36 and 38 extend through slots 40 in the alignment tool 32 to permit displacement of the alignment tool from an extended position to a retracted position between the two insertion combs 28. A pair of springs 44 bias the alignment tool 32 to its extended connector engaging position. The pins 36 also locate the two insertion tool combs 28 on the rear mounting block 24.

Figure 3:
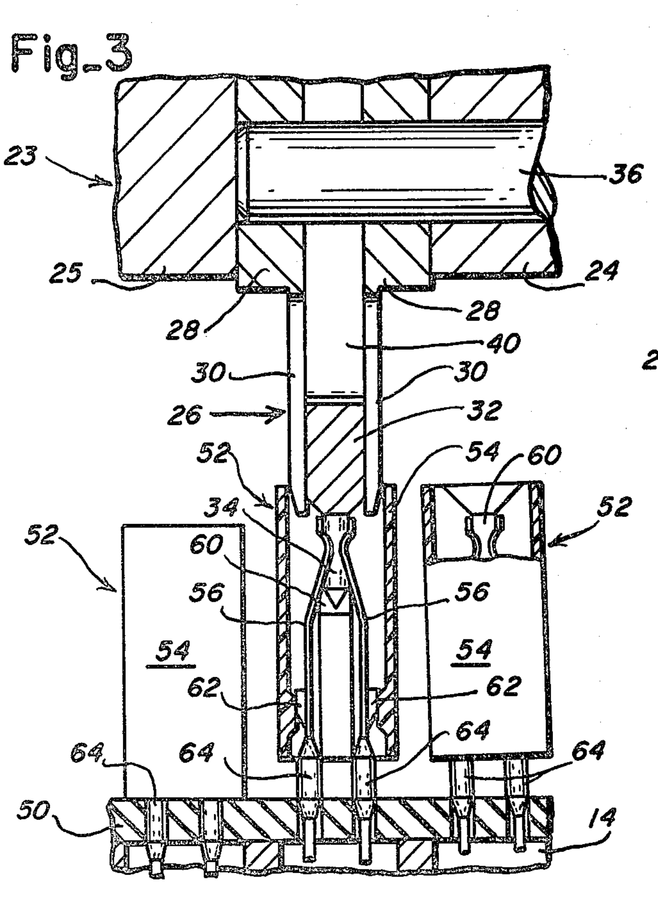
FIGS. 3 and 4 are side views in section of the connector insertion head and a series of press fit connectors.
Figure 4:
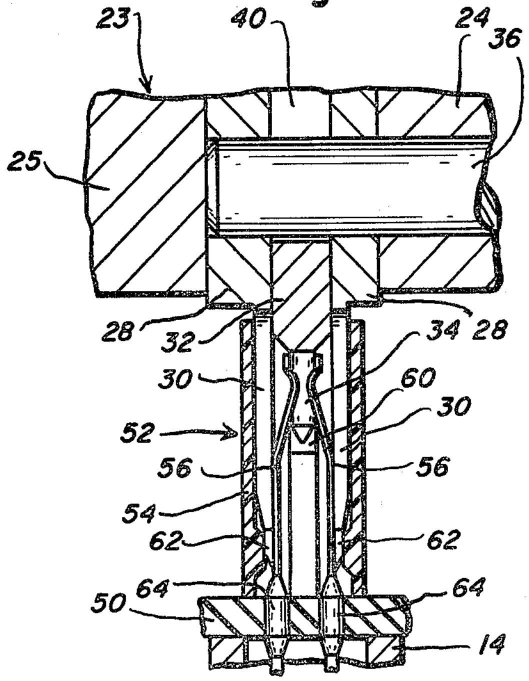

A circuit board 50 having a preassembled press fit connector 52 loosely inserted in aperture arrays therein may be located on the pallet 14. As shown in FIG. 3, the connectors 52 each comprise a housing 54 and two rows of contacts 56 mounted therein. The housing 54 includes an alignment slot 60 and each contact 56 includes a shoulder 62 and a press fit section 64. The alignment pin 34 is configured to be received by the alignment slot 60 and the insertion combs 28 are spaced apart to permit the comb teeth 30 to enter the connector housing 54 and apply pressure to the contact shoulders 62 to force the press fit section of the contacts into the printed circuit board, as shown in FIG. 4.

In operation, the bed 12 advances the pallet 14 and the circuit board 50 to position a connector 52 beneath the insertion head 26, as shown in FIG. 2. The press bar assembly then lowers and the sensor arms 22 engage the circuit board proximate the ends of the connector 52 to sense the thickness of the board 50 in order to precisely control the continued press bar descent. The alignment pins 34 of the extended alignment tool 32 internally engage the slot portions 60 of the connector housing 54, as shown in FIG. 3, thereby precisely aligning the connector contacts 56 with the teeth 30 of the two insertion tool combs 28. Continued lowering of the press bar causes the alignment tool 32 to be, in effect, retracted between the insertion combs 26, as the comb teeth 30 engage the shoulders 62 of the press fit contacts 56. The alignment tool and the insertion combs, acting in concert, then pressingly mates the connector with the printed circuit board 50, as shown in FIG. 4.

In the preferred embodiment, the lowermost position of the press bar 20 and, accordingly, of the insertion head 26 is determined by the average circuit board thickness sensed by the two sensor assemblies 21 during a pressing operation. Once a given connector has been mated to the circuit board, the insertion head is withdrawn to its original raised position and conventional means, not shown, are used to advance the pallet and circuit board to locate the next connector under the insertion head.

What is claimed is:

1. A connector mounting press for pressing loosely fit connectors into a printed circuit board wherein the connector comprises a housing and two adjacent rows of press fit contacts and the circuit board comprises rows of plated through apertures, the mounting press comprising:
   - selectively horizontally locatable bed means for supporting a circuit board,
   - insertion head means supported above said bed means for vertical displacement relative thereto,
   - said insertion head means including a first comb means, a second comb means, and alignment means,
   - said alignment means being slidably mounted between said first and second comb means for initially engaging the interior of a selected connector and accurately positioning said connector for reception of said first and second comb means,
   - the slidable mounting of said alignment means with respect to said first and second comb means allowing both of said comb means to be displaced relative to said alignment means to engage first and second rows of contacts subsequent to the engagement of the connector by said alignment means while said alignment means maintains accurate positioning of said connector, whereby continued vertical displacement of said insertion head causes said first and second comb means to press said rows of contacts of said connector into mating engagement with rows of plated through apertures.

2. A connector mounting press according to claim 1 further including vertically displaceable first and second sensor means for determining the thickness of the board proximate opposing ends of the selected connector for selectively displacing said insertion head according to the average sensed thickness to mate the selected connector with the printed circuit board.

3. A connector mounting press for pressing loosely fit connectors into a printed circuit board wherein the connector comprises a housing and two adjacent rows of press fit contacts and the circuit board comprises rows of plated through apertures, the mounting press comprising:

selectively horizontally locatable bed means for supporting a circuit board, insertion head means supported above said bed means for vertical displacement relative thereto, said insertion head means including first comb means engaging and pressing one row of the connector contacts, second comb means for engaging and pressing the other row of the connector contacts simultaneously with said first comb means, and alignment means for internally engaging the connector housing and aligning the contacts with said first and second comb means, said alignment means being slideably mounted between said first and second comb means for vertical displacement between an extended connector engaging position and a retracted connector pressing position, means for lowering said insertion head means having said alignment means in its extended position into initial engagement with the connector housing, means for further lowering said insertion head means into engagement with the connector contacts thereby locating said alignment means in its retracted connector pressing position, and means for further lowering said insertion head means to pressingly mate the connector with the printed circuit board.

* * * * *